United States Patent
He et al.

(10) Patent No.: US 6,621,067 B2
(45) Date of Patent: Sep. 16, 2003

(54) POLARIZATION INDEPENDENT PHOTODETECTOR DEVICE AND METHOD OF MAKING SAME

(75) Inventors: Gang He, Sainte-Foy (CA); François Babin, Charlesbourg (CA); Martin Tremblay, St-Marc-des-Carrières (CA); Marc Breton, Quebec (CA); Steeve Potvin, Quebec (CA); Gregory Walter Schinn, Quebec (CA)

(73) Assignee: EXFO Electro-Optical Engineering Inc., Vanier (CA)

( * ) Notice: Subject to any disclaimer, the term of this patent is extended or adjusted under 35 U.S.C. 154(b) by 60 days.

(21) Appl. No.: 09/796,796

(22) Filed: Mar. 2, 2001

(65) Prior Publication Data

US 2001/0048070 A1 Dec. 6, 2001

Related U.S. Application Data (60) Provisional application No. 60/186,677, filed on Mar. 3, 2000, and provisional application No. 60/221,501, filed on Jul. 28, 2000.

(51) Int. Cl.⁷ .................................. G02F 1/01
(52) U.S. Cl. .................. 250/225; 250/214.1; 356/366
(58) Field of Search .......................... 250/225, 227.17, 250/548, 559.3, 201.1, 214.1; 356/366, 367, 368, 487

(56) References Cited

U.S. PATENT DOCUMENTS

| | | | |
|---|---|---|---|
| 4,681,450 A | * | 7/1987 | Azzam ........................ 356/367 |
| 5,440,117 A | | 8/1995 | Garrett et al. |
| 5,504,582 A | | 4/1996 | Johs et al. |
| 5,604,636 A | | 2/1997 | Asami et al. |
| 5,805,285 A | | 9/1998 | Johs et al. |
| 6,373,614 B1 | * | 4/2002 | Miller ........................ 359/237 |
| 6,417,922 B1 | * | 7/2002 | Dirksen et al. ............. 356/401 |

FOREIGN PATENT DOCUMENTS

EP   06331940   12/1994

\* cited by examiner

Primary Examiner—Kevin Pyo
Assistant Examiner—Seung C. Sohn
(74) Attorney, Agent, or Firm—Thomas Adams

(57) ABSTRACT

A photodetector device comprising a photosensitive detector (12; 96) and one or more interfaces (20', 20", 28, 98) between dissimilar media is configured so that a light beam (LB) for detection will pass through the interface(s) along a beam axis that is not normal to the interface(s). The deviation ($\theta$) from the normal will be such that polarization dependent transmission introduced at the interface(s) will compensate for inherent polarization dependency of the detector (12; 96). The deviation may be achieved by inclining the interface(s) relative to a predetermined direction along which the light beam will be incident. Where the photosensitive detector is in a housing (84) with a window (20) through which the light beam enters the housing, the housing can be tilted. In such as case, there are three interfaces, one (28; 98) at the surface of the detector (12; 96), and one at each surface (20', 20") of the window (20). Alternatively, the detector surface and/or the window could be tilted. Where a pigtail fiber (116) is permanently attached to the photodetector device to input the light beam through an interposed lens (106), the end of the pigtail fiber may be offset laterally from the lens optical axis (LOA) so that the beam axis deviates from the normal by such an angle that the resulting polarization dependent transmission (PDT) substantially corrects for polarization dependent response (PDR) of the photosensitive detector. An end facet of the pigtail fiber, the lens, and/or the window may be inclined so that they are not perpendicular to the propagation direction of the light beam so as to reduce interference and backreflection effects.

35 Claims, 6 Drawing Sheets

FIG. 15

POLARIZATION INDEPENDENT PHOTODETECTOR DEVICE AND METHOD OF MAKING SAME

This appln claims benefit of Prov. No. 60/186,677 filed Mar. 3, 2000 and claims benefit of Prov. No. 60/221,501 filed Jul. 28, 2000.

TECHNICAL FIELD

The invention relates to photodetector devices, especially semiconductor photodetector devices, and to a method of compensating for polarization dependent response of a photodetector of such a photodetector device. The invention is applicable to so-called "pigtailed" photodetector devices which have an integral optical waveguide, for example an optical fiber, for directing light onto a detection surface of the detector, and to so-called "connectorized" photodetector devices which have means for attachment of a separate optical waveguide.

BACKGROUND ART

Photodetector devices preferred for use in, for example, telecommunications systems, use semiconductor diodes, usually made of germanium or indium gallium arsenide (InGaAs). Where relatively long wavelengths are involved, such as in Dense Wavelength Division Multiplex (DWDM) systems, InGaAs detectors are preferred over germanium detectors because the former exhibit better temperature stability and more uniform sensitivity, especially in the longer wavelength spectral ranges of typical DWDM telecommunications systems. They also have a lower dark current. Both of these kinds of photodetector devices exhibit a response that depends upon the state of polarization (SOP) of the incident light. Unfortunately, however, InGaAs photodetector devices have a relatively high polarization dependent response (PDR) as compared with germanium photodetectors. For InGaAs photodetector devices, the PDR, i.e., the difference between maximum and minimum responses, typically is around 0.02 dB whereas, for germanium photodetectors, the typical PDR is about 0.005 dB. Consequently, when an InGaAs photodetector device is used to measure, for example, polarization dependent loss, the measurement accuracy is limited because of the relatively high PDR of the photodetector device.

An object of the present invention is to at least ameliorate the afore-mentioned problem of polarization dependency of photodetector devices which have a maximum response to incident light corresponding to a particular substantially linear SOP of that light.

DISCLOSURE OF INVENTION

According to a first aspect of the present invention, there is provided a photodetector device comprising a photosensitive detector formed from a material having a polarization dependent response having maximum ($R_{MAX}$) and minimum ($R_{MIN}$) values corresponding to substantially linear states of polarization of light incident thereupon that are orthogonal to each other, and at least one interface through which a light beam for detection passes before being incident upon a detection surface of the detector, the light beam traversing said at least one interface with a propagation direction that is not normal to the interface, the arrangement being such that said at least one interface is tilted about an axis substantially parallel to the direction of the linear state of polarization corresponding to said maximum (RMAX) value and by such a tilt angle that polarization dependent transmission introduced by the at least one interface will compensate at least partially for the polarization dependent response of the material of the photosensitive detector.

In one embodiment of the first aspect of the invention, the device has a window whereby, in use, the light is directed onto the detection surface, the detection surface and opposite surfaces of the window providing three said interfaces, cumulatively providing the compensation for polarization dependent response.

The photodetector device may have a connector part for releasably attaching to the device a waveguide for directing the light to said window along an optical axis (OA) of the waveguide, each of said three interfaces being at an acute angle to said optical axis.

The window may be fixed generally parallel to the detector surface and both tilted to the required degree, in which case three interfaces will provide the required compensation. Alternatively, the detection surface may be substantially normal to the propagation direction of the light when incident thereupon and opposite surfaces of the window provide two said interfaces that cumulatively provide the compensation for polarization dependent response.

The photodetector device may be mounted to a mount with its maximum response axis having a predetermined orientation relative to a reference surface of the mount. The mount may then be installed on or in the connector part so as to allow tilting of the mount about the maximum response axis or an axis parallel thereto. The connector part may be part of, or fitted to, equipment in which the photodetector device is to be used. This arrangement allows PDR compensation to be provided after the photodetector device has already been assembled.

Alternatively, the interface may comprise an angled end surface of a waveguide, typically an optical fiber, through which the light is directed onto the detector, either directly or by way of another interface provided by a said window or an intervening lens. In the latter case, the required polarization dependent transmission effect would be provided cumulatively by the interfaces.

In a further embodiment of the first aspect of the invention, the photodetector device comprises a photodetector, a lens and an input optical fiber for directing a light beam, in use, through the lens and onto the detection surface, the optical fiber having its end from which the light beam emerges secured relative to the lens with a lateral displacement relative to the lens optical axis so that the optical axis of the light beam when leaving the lens will be inclined relative to the lens optical axis by such an angle that polarization dependent transmission introduced thereby substantially corrects for polarization dependent response of the photodetector per se.

According to a second aspect of the present invention, there is provided a photodetector device comprising a photosensitive detector and a fiber waveguide for directing a light beam for detection onto a detection surface of the detector, the waveguide being fixed relative to the detector and having an end face facing the detection surface, the end face being inclined by such an angle that polarization dependent transmission effects introduced by the end face at least partially compensate for polarization dependent response of the detector.

According to a third aspect of the invention, there is provided a method of correcting for polarization dependent response of a photodetector device comprising a photosensitive detector having a maximum response ($R_{MAX}$) corresponding to linear state of polarization of light incident thereupon via at least one interface between media having different refractive indices, the interface intersecting a propagation direction in which, in use, a light beam for detection will be incident upon a detection surface of the detector, the method comprising the steps of:

determining orientation of either or both of a maximum response axis and minimum response axis that correspond to states of polarization of incident light for which the response of the photodetector is a maximum or minimum, respectively; and     adjusting an angle between the propagation direction and the interface in a plane of the maximum response axis such that polarization dependent transmission introduced by the interface at least partially compensates for polarization dependent response of the detector.

The reference to a direction in which a light beam will, in use, be incident upon the detector is intended to take account of the fact that the light beam may be collimated or divergent. In each case, the light beam will be substantially symmetrical about its beam/cone axis which, preferably, extends substantially parallel to the optical axis and intersects the detector at or near its geometrical centre; otherwise the detector must be considerably wider than the beam spot.

The determination of the maximum response axis of the photosensitive detector may comprise the steps of directing a substantially symmetrical, polarized light beam onto the detector and monitoring a corresponding output signal of the detector; varying the state of polarization between a substantial number of possible states; identifying either or both of maximum and minimum values of the detector output signal; and, while maintaining that state of polarization which provided the maximum or minimum value, analyzing the light to determine the orientation of the maximum response axis of the detector.

Preferably, the light beam is collimated, though it could be converging or diverging.

The accuracy of the determination will depend upon the number of polarization states selected. While it would be possible to use the subset comprising linear SOPs, the polarization controller permits the selection of substantially all of the points on a Poincaré sphere. Such variable polarization controllers are well known.

While it is preferable to use a highly-polarized light beam, it is possible to use any light beam having a significant non-zero degree of polarization.

Accordingly, an alternative embodiment of the third aspect of the invention is a method of determining the maximum-response-axis response of the photosensitive detector comprising the steps of directing linearly polarized light onto the detector along the optical axis, repeatedly rotating the SOP of the linearly polarized light beam about the optical axis, tilting the at least one interface relative to the optical axis and about the maximum response axis, and determining said angle for which the difference between maximum and minimum responses of the photodetector is substantially minimal.

The subsequent determination of the required tilt angle may comprise the steps of directing linearly polarized light onto the detector along the optical axis, repeatedly rotating the SOP of the linearly polarized light beam about the optical axis, tilting the interface relative to the optical axis and about the maximum response axis, and determining the tilt angle for which the difference between maximum and minimum responses of the photodetector is substantially minimal.

Alternatively, the required tilt angle may be determined by the steps of: directing a polarized light beam onto the detector and monitoring a corresponding output signal of the detector; varying the state of polarization between a substantial number of possible states; and varying the angle of the interface to select an angle for which the difference between the maximum and minimum values of the output signal is substantially minimal, the selected angle being said tilt angle.

The photodetector device may be mounted rotatably in a mount while its maximum response axis is being determined and, once the maximum response axis is known, secured to the mount with the maximum response axis having a known orientation relative to a reference surface of the mount. The mount then may be used to install the photodetector into a holder or other part of, or for assembly to, the equipment with which the photodetector is to be used. Once the mount is installed, the tilt angle can be determined by directing a linearly polarized light beam onto the detector along said optical axis; repeatedly rotating the SOP of the linearly polarized light beam about the optical axis, tilting the mount relative to the holder and about the maximum response axis and measuring the output of the photodetector so as to determine the tilt angle at which the difference between maximum and minimum responses of the photodetector is minimal, whereupon the mount can be secured to the holder so as to maintain that tilt angle.

The interface may be at the surface of the photosensitive detector or at a surface of a window through which the light to be detected is incident upon the photosensitive detector. Such a window may provide two such interfaces.

In an alternative embodiment of the third aspect of the invention, the detector and window are fixed relative to each other in a housing of the photodetector device and the step of tilting the interface involves tilting of the housing, so that the window and the detector surface are tilted together. This method is suitable for use after the photodetector device has been manufactured.

According to a fourth aspect of the invention, a method of assembling a photodetector device according to such further embodiment comprises the steps of directing a polarized light beam onto the detector and varying the state of polarization of the light beam between a large number of possible states; adjusting the displacement of the optical fiber transversely relative to the optical axis of the lens while monitoring the difference between maximum and minimum values of the detector output signal; and fixing the optical fiber relative to the lens at a transverse displacement corresponding to the difference being a minimum.

Hence, in this case, it is not necessary to determine the maximum and minimum polarization dependent response axes of the detector beforehand.

Preferably, the light beam emerging from the lens is substantially collimated, though it could be converging or diverging.

The accuracy of the adjustment will depend upon the number of polarization states selected. While it would be possible to use the subset comprising linear SOPs, the polarization controller permits the selection of substantially all of the points on a Poincaré sphere. The variable polarization controller may comprise a polarization scrambler for randomly varying the SOP, or a controller which varies the SOP systematically. Such polarization controllers are well known.

While it is preferable to use a highly-polarized light beam, it is possible to use any light beam having a significant non-zero degree of polarization.

In one embodiment of the fourth aspect of the invention, the detector is mounted in a housing of the photodetector device and the lens is attached to the housing so as to direct light onto the detector through an opening in the housing. The lens receives the light from a fiber waveguide which then is offset laterally with respect to the optical axis of the lens to vary the angle at which the light impinges upon the detector surface.

According to a further aspect of the invention, there is provided a method of correcting for polarization dependent response of a photodetector device comprising a photosensitive detector (26; 96) having a maximum response ($R_{MAX}$) corresponding to linear state of polarization of light incident thereupon via at least one interface (20',20",28,98) between media having different refractive indices, the interface intersecting a propagation direction in which, in use, a light beam for detection will be incident upon a detection surface (28; 98) of the detector (26; 96), the photosensitive detector having a photodetector axis (PDA) perpendicular to its detection surface, the method comprising the steps of:

with the photodetector device mounted rotatably in a connector part (16) with said photodetector axis (PDA) extending at an arbitrary acute angle (θ) to an optical axis (OA) of said connector part, directing polarized light onto the detection surface (28; 98);

while varying the state of polarization of the light successively between a substantial number of points on the Poincaré sphere, monitoring an electrical output signal from the photosensitive detector (26; 96) and registering the difference between maximum and minimum values thereof, rotating the photodetector device (12) step by step using the photodetector axis (PDA) as a rotation axis, at each step, registering the difference between the maximum and minimum response and determining the rotation angle for which the difference is a minimum;

while maintaining said rotation angle constant, varying the state of polarization again through a substantial number of points on the Poincaré sphere, monitoring the output of the photosensitive detector (26; 96), adjusting the acute angle (θ) with respect to the optical axis (OA), in a step by step manner, and determining the acute angle at which the difference between the maximum and minimum values is a minimum; and securing the photodetector device to the connector part (16) to maintain said rotation angle and said acute angle at which the difference between the maximum and minimum values is a minimum.

Typically, the acute angle is between 5 degrees and 8 degrees.

Embodiments of the various aspects of the present invention will now be described by way of example only and with reference to the accompanying drawings.

BEST MODE(S) FOR CARRYING OUT THE INVENTION

Figures 1, 2:
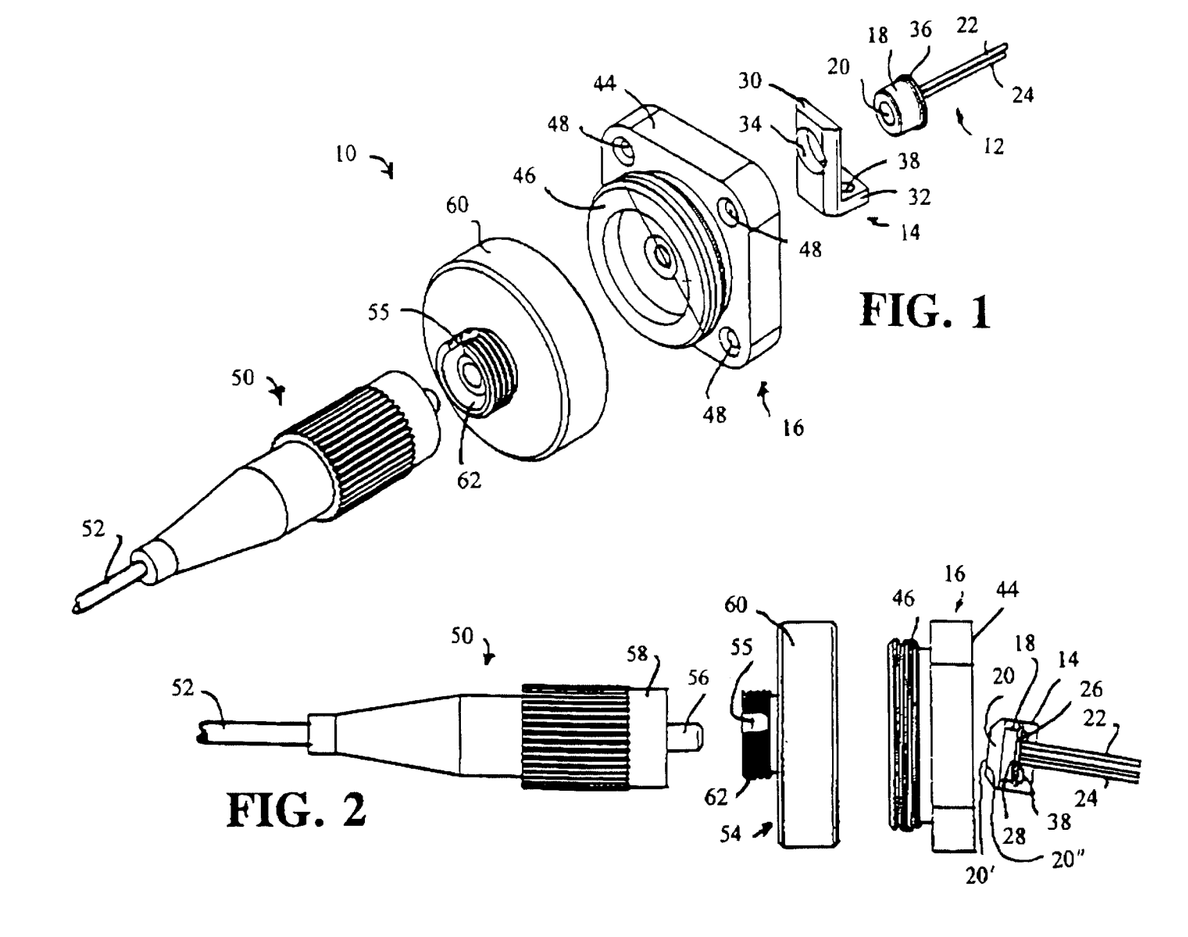
FIG. 1 is an exploded perspective view of a photodetector assembly assembled by a method according to a first embodiment of the invention.
FIG. 2 is an exploded plan view of the assembly of FIG. 1.
Figures 3, 4:
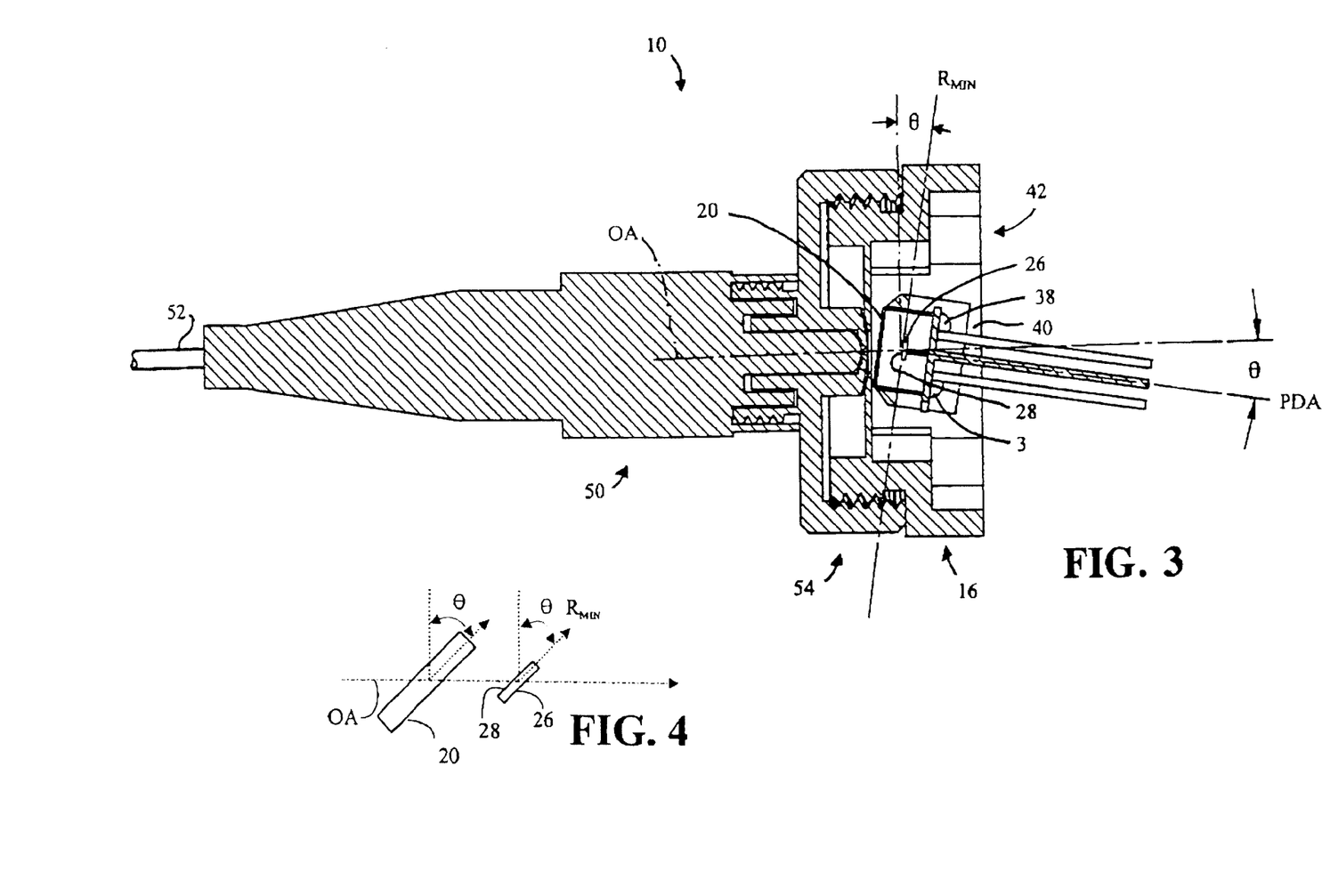
FIG. 3 is a cross-sectional plan view of the photodetector assembly with the parts assembled.
FIG. 4 illustrates tilting of the surface of a photosensitive detector and a window through which light is incident upon the surface.

Referring to FIGS. 1, 2 and 3, a photodetector assembly 10 comprises a photodetector device 12, a mount in the form of a bracket 14 and a holder 16, the latter for securing the photodetector device 12 to a panel (not shown) of, for example, a piece of equipment such as an optical power meter. The photodetector device 12 has a generally cylindrical housing 18 having at one end a glass window 20 and, protruding from its other end, a pair of conductors 22 and 24. As shown in FIG. 3, within the housing 18, a photosensitive detector 26, specifically an InGaAs photodiode, is positioned with its light-detecting surface 28 parallel to the glass window 20. The bracket 14 is L-shaped with a pair of perpendicular arms 30 and 32. A cylindrical hole 34 extends through the arm 30 and is large enough to receive the photodetector housing 18. When the photodetector device 12 is inserted fully, a lip 36 protruding radially around the rearmost edge of the housing 18 abuts the bracket arm 30. The other arm 32 has a pair of holes 38 whereby it can be attached to a sidewall 40 of a recess 42 (FIG. 3) in one side of a flat portion 44 of the holder 16 by screws (not shown). A cylindrical boss 46 protrudes from the opposite side of the plate 44 and has an external screwthread. In use, the holder 16 will be attached to the outside of the instrument's panel and secured by screws (not shown) extending through holes 48 in the flat portion 44. A fiber connector 50, of known construction, is used to connect an optical fiber 52 to the holder 16 by way of an adapter 54. The fiber connector 50 has at one end a ferrule 56 to which the optical fiber 52 is connected, and a surrounding sleeve 58 which is screwthreaded internally. The adapter 54 has a key slot 55 to engage a corresponding key (not shown) of the connector 50. This allows use with industry standard connectors.

The adapter 54 is used because the diameter of the sleeve 58 is less than the diameter of the screwthreaded boss 46 of the holder 16. The adapter 54 comprises a first cylindrical portion 60 which has an internal screwthread matching that of the boss 46 and a second, smaller cylindrical portion 62 which has an external screwthread matching that of the sleeve 58. When the adapter 54 is screwed onto the boss 46 and the fiber connector 50 attached to the adapter 54 by screwing the sleeve 58 onto the adapter 54, the cylindrical axis of the optical fiber 52 is aligned with the cylindrical axis of the holder 16.

As can be seen more clearly in FIG. 3, the bracket 14 is mounted onto the sidewall 40 of recess 42 in the holder 16 so that the surface 28 of the photodiode 26 and the surfaces 20'; 20" of the glass window 20 are not perpendicular to the optical axis OA extending through the holder 16 and the optical fiber 52. A light beam leaving the optical fiber 52 will be substantially symmetrical about the optical axis OA, and so will be incident upon the glass window 20 and the surface 28 of the photodiode 26 in a propagation direction which is not normal to them.

The window 20 and surface 28 both are tilted about an axis which is coincident with, or parallel to, a maximum response axis of the photosensitive detector 26. The angle θ through which the glass window 20 and the surface 28 are tilted from the normal to optical axis OA will depend upon the inherent polarization-dependent response of the photosensitive detector 26.

It is known that tilting an interface between two light-transmissive media relative to the direction of incidence of a light beam will introduce polarization dependency. As illustrated in FIG. 4, light incident upon the photodiode 26 will traverse three such interfaces, namely the air/glass and glass/air interfaces 20' and 20", respectively, at opposite sides of the window 20 and the air/surface 28 interface of the photodiode 26 itself. Tilting of the bracket 14 causes all three interfaces to tilt relative to the optical axis of fiber 52, and hence to the direction in which the light will be incident upon the photodiode 26. Because the refractive index of the semiconductor medium is higher than most glasses, and in particular the glass plate 20, the effect of the polarization dependency induced by the interface at surface 28 is considerably less than the effect of the polarization dependency introduced by tilting of the air-glass/glass-air interfaces 20', 20".

In order to determine the axis about which the interfaces 20' 20", 28 are to be tilted, the PDR of the photodetector 12 is measured before assembly of the parts shown in FIGS. 1 to 3. Three procedures for doing so will be described, the first using equipment as illustrated schematically in FIG. 5. The equipment comprises a light source 64, for example a laser, for supplying highly polarized light to a polarization controller 66 which varies, in time, the state of polarization of the light and supplies the polarized light via an optical fiber 68 to a collimating lens 70, for example a GRIN lens, which directs the collimated light onto the photodetector 12. A polarizer 72 can be inserted into the collimated beam and rotated, as will be described later. The conductors 22 and 24 of the photodetector 12 are coupled to a meter 74, for example an ammeter, which measures and displays the output signal of the photodetector 12. Where the photodetector 12 is part of an optical power meter, the meter 74 could comprise the electronics and display of the optical power meter. The photodetector 12 is mounted rotatably in the bracket 14, which is not shown in FIG. 5 for clarity.

Figure 5:
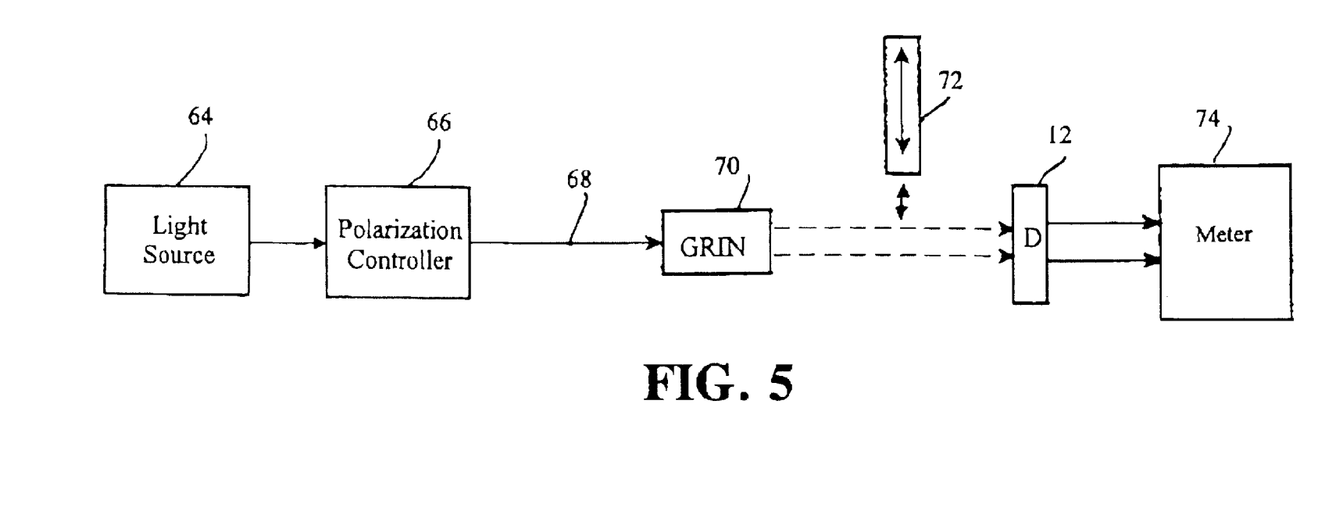
FIG. 5 illustrates, schematically, equipment for determining maximum response axis.

To determine the maximum response axis, the polarization controller 66 is adjusted, without the polarizer 72 in the collimated beam, to vary the polarization state of the input light beam so as to select randomly substantially all possible states of polarization i.e., points on the Poincaré sphere. While this is happening, the meter 74 is monitored and the maximum and minimum levels of the output signal are noted. It has been found that, generally, the maximum and minimum values will correspond to two orthogonal states of polarization. Consequently, once one has been found, the other can be inferred. The output of the polarization controller 66 then is held steady at the state of polarization for which the maximum (or minimum) was detected and the polarizer 72 is inserted into the collimated beam and used as an analyzer to determine the orientation of linear SOP of the light from the controller 66. This, the polarizer 72 is rotated until it is aligned with the SOP of the light from the controller 66 corresponding to a maximum reading, or perpendicular to the SOP, corresponding to a minimum, substantially zero, reading. The orientation of the state of polarization of the polarizer 72 then is transferred to the photodetector 12 as the maximum response axis $R_{MAX}$, or the minimum response axis $R_{MIN}$ as the case may be. With the minimum response axis $R_{MIN}$ parallel to the outermost surface of arm 32 of the bracket 14 (see FIG. 3), and the maximum response axis $R_{MAX}$ orthogonal thereto, the photodetector 12 is glued to the bracket 14. The surface of the arm 32 then can be used as the reference when mounting the photodetector 12 to the holder 16 and tilting the bracket 14.

An advantage of this procedure is that it can be used to confirm that the detector does indeed have a maximum response axis corresponding to a substantially linear SOP. Thus, if rotating the polarizer through 90 degrees from the maximum response axis does not cause substantial extinction, the PDR of the detector is not characterized by substantially linear SOP response axes.

While the above-described method is preferred because the polarization controller 66 allows substantially all polarization states to be selected, it is possible to determine the maximum response axis in other ways, for example, only linear SOPs could be used, as described below:

(i) The photodetector 12 is inserted into the hole 34 in the L-shaped bracket 14 until its lip 36 abuts the bracket and the bracket 14 then is supported in a jig (not shown). At this stage, the photodetector 12 can be rotated in the hole 34.

(ii) A linearly-polarized light beam is directed onto the surface 28 of the photodiode 26 along an axis that is substantially normal to the surface 28.

(iii) Relative rotation of the state of polarization of the light beam relative to the photodiode 26 is effected by rotating either the SOP of the light beam or the detector about the normal axis and the photodetector response is measured at different angles of rotation.

(iv) The orientations of the maximum response axis $R_{MAX}$ and minimum response axis $R_{MIN}$ are determined. (Because they are orthogonal, determination of one also gives the other.)

(v) The photodetector 12 is secured to the bracket 14, conveniently using adhesive, with the minimum response axis $R_{MIN}$ parallel to a reference surface of the bracket 14, specifically the outermost surface of arm 32.

As shown in FIG. 3, the axis of minimum response $R_{MIN}$ now extends in or parallel to the plane of surface 28 and substantially parallel to the outermost surface of arm 32 of bracket 14. The axis of maximum response $R_{MAX}$ (not shown in FIG. 3) also lies in the plane of surface 28 but orthogonal to minimum response axis $R_{MIN}$. In FIG. 3, therefore, the maximum response axis $R_{MAX}$ extends out of the paper. Once the maximum response axis has been determined, it is necessary to determine the angle at which the photodetector 12 (and hence the interfaces) must be tilted to compensate for the inherent polarization dependency of the photodiode 26. For this, the assembly of parts shown in FIGS. 1 and 2 is used, but with the fiber 52 connected to the polarization controller 66 and light source 64 of FIG. 5.

Using a suitable jig (not shown), the bracket 14 is positioned upon the sidewall 40 of recess 42 in the holder 16 so that the surface 28 of the photodiode 26 is generally aligned with the optical axis extending through the centre of the holder 16. At this stage, the bracket 14 is not fixed.

The fiber connector 50 is attached to the holder 16 by means of the adapter 54 and polarized light is directed from the fiber 50 onto the surface 28. The polarized light may be supplied by the source 64 and polarization controller 66 used to determine the maximum response axis, as described with reference to FIG. 5. The polarization controller 66 is adjusted to vary the SOP of the polarized light to generate, in time, substantially all of the possible states of polarization of the light beam, i.e., for a representative number of points on the Poincaré sphere. Preferably, this adjustment of the polarization controller 66 is under automatic control.

While the SOP is varying, the bracket 14 is tilted step-by-step and the output of meter 74 is monitored. It will be observed that the difference between the maximum and minimum values of the output signal will vary according to the angle of the detector 12, specifically of the interfaces at the surfaces of the glass window and the semiconductor device, respectively. For one tilt angle, the difference will be a minimum. The bracket 14 will be secured to the holder 16 at this tilt angle.

Just as there were other ways of determining the orientation of the maximum response axis, there are other ways of determining the required tilt angle. One using only linear SOPs will now be described.

As before, with the photodetector 12 glued in place, the bracket 14 is positioned on the holder 16 and linearly-polarized light from the polarization controller 66 directed onto the photosensitive detector 26.

The SOP of the linearly-polarized light beam is rotated about the optical axis and the bracket 14 tilted relative to the holder 16 about the maximum response axis $R_{MAX}$ (or an axis parallel thereto), and the response of the photodetector 12 measured so as to determine a tilt angle θ at which the difference between maximum and minimum responses of the photodetector is a minimum. The bracket 14 then is fixed, preferably adhered, to the sidewall 40 of the holder 14 so as to maintain that tilt angle θ.

As illustrated in FIG. 4, both the glass window 20 and the surface 28 of the detector diode 26 then are inclined relative to the direction along which light from the optical fiber 52 will be incident upon the diode 26.

It should be noted that, in FIGS. 2 and 3, the size of tilt angle θ is exaggerated for purposes of illustration. A typical tilt angle θ might be about 5–7 degrees. The direction of tilt will be such that the effective response of the photodetector 12 along the respective axes $R_{MAX}$ and $R_{MIN}$ will be equalized, i.e., the overall PDR of the photodetector device 12 will be substantially uniform.

Figure 15:
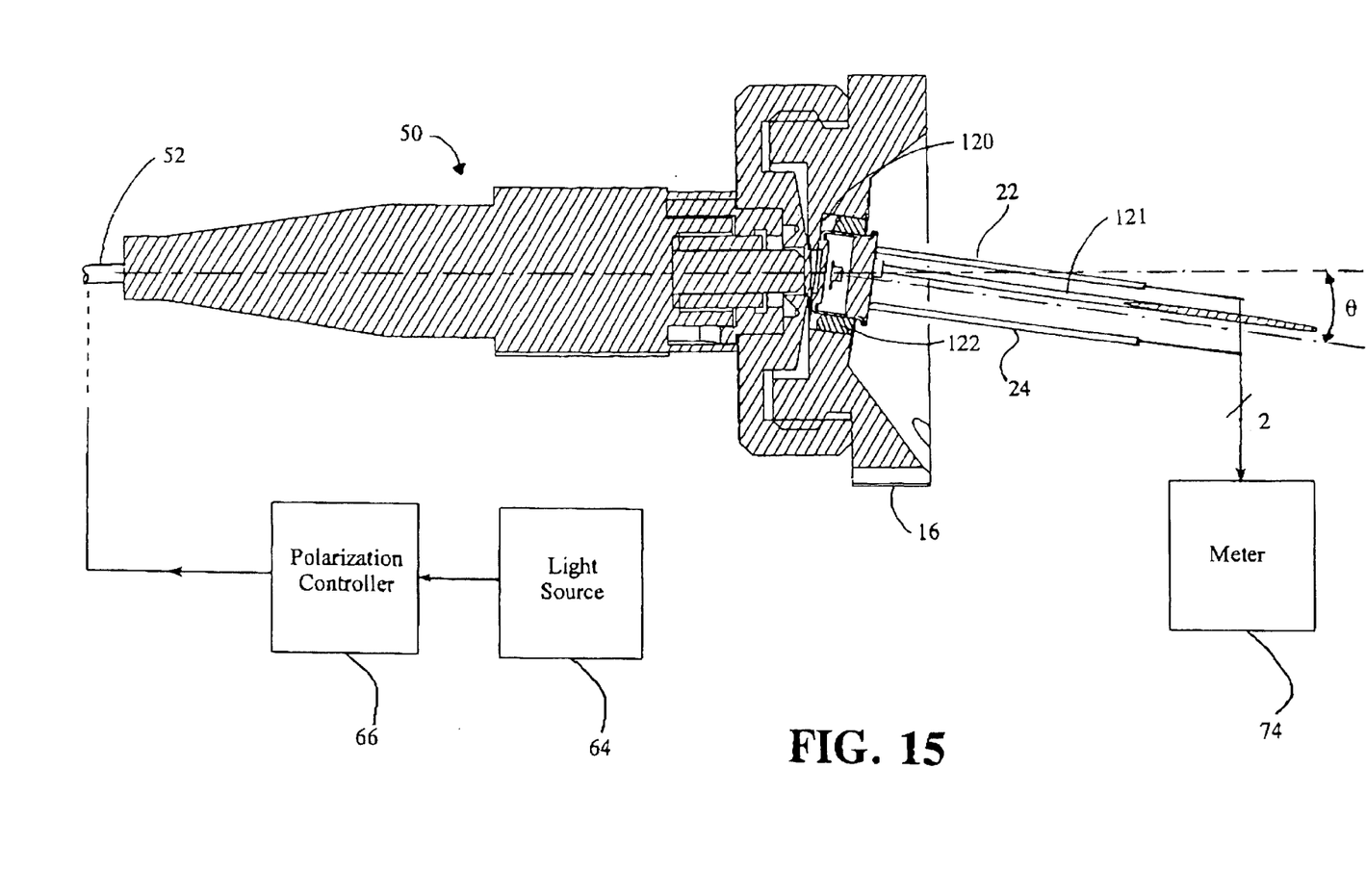
FIG. 15 illustrates a photodetector device assembled by yet another method.

An alternative method for aligning the photodetector device, slightly different from the above-described method, does not involve insertion of a linear polarized analyzer to determine the maximum (or minimum) response axis, but may use all of the other components of FIGS. 1, 2 and 3, with the exception of the "L bracket" 14. Referring to FIG. 15, the photodetector 12 is inserted loosely into a hole 120 in the connector part 16 and supported by a suitable jig 121 which can be used to rotate it around the photodetector axis PDA and tell it to vary angle θ. Initially, the angle θ is set to an arbitrary angle θ with respect to the optical beam propagation axis (OA) in FIGS. 3 and 4). A typical value of this arbitrary tilt angle would be 5 to 6 degrees, The conductors 22 and 24 of the photodetector device 12 are coupled to the electronics of an optical power meter 74 or to an ammeter. Using a polarization controller, the SOP of the light from a light source 64 is varied in such a way as to cover, in time, substantially all of the points on the Poincaré sphere. While the SOP is varying, the signal from the photodetector device 12 is monitored with the meter 74 and the difference between the maximum and minimum values during successive intervals of about 30 seconds is registered. Using the jig, the photodetector device is rotated, step by step, with the photodetector device axis (PDA) as the axis of rotation, i.e. perpendicular to the photodetector surface 28. At each step, the difference between the maximum and minimum response is registered, and the azimuthal orientation for which the difference is a minimum is the orientation for which the maximum response axis, $R_{MAX}$, is perpendicular to the plane containing the axes OA and PDA. The photodetector device 12 is held at this rotation angle and, using the jig, the photodetector device 12 is tilted with respect to the optical axis, OA, in a step by step manner, to vary the angle θ, while monitoring the output of the photodetector 12 again. When a minimum is reached in the registered difference between the maximum and minimum values, the PDR of the photodetector device should then be minimum. The photodetector device 12 is then glued to the holder, i.e., connector part, 16 by injecting adhesive 122 between the sides of the housing 18 and the hole 120. In effect, the first "roll" measurement determines the orientation of the maximum-response axis and the subsequent "pitch" adjustment is used to minimize the PDR of the photodetector device 12.

The invention is predicated upon the fact that the maximum and minimum responses correspond to orthogonal, substantially linear SOPs, and that the geometric orientation of these axes with respect to the material of the detector is constant with respect to time. The invention is further predicated upon the fact that the transmission of light through an optical interface between two media having different refractive indices (e.g. air-glass) is polarization dependent if the light is not incident upon the interface along the normal to the interface. This arises because the reflection of the light beam at the interface is polarization dependent, so, by conservation of energy, the transmitted portion of the light beam also is polarization dependent. An incident light beam having a linear SOP lying in the plane of reflection ("p" polarization) will be preferentially transmitted past the interface as compared with a light beam having a linear SOP perpendicular to the plane of reflection ("s" polarization). For the case of a light beam passing through a glass plate, this polarization dependency is effectively doubled because of the presence of two air-glass interfaces. Likewise, the fraction of the light absorbed (i.e., transmitted past the interface at the surface of the semiconductor material) by a tilted semiconductor detector (e.g. InGaAs) is polarization dependent, with the portion having "p" polarization being absorbed preferentially as compared with the portion having "s" polarization. However, on account of the higher refractive index of the semiconductor medium compared with most glasses, this polarization dependence is less marked than with transmission through an air-glass interface at the same tilt angle.

It is possible, therefore, to select a tilt angle θ such that the polarization dependency introduced by the interface(s) compensates for the inherent polarization dependency of the photosensitive detector. Consequently, the above-described embodiment of the invention may be applied after the detector and the window have been assembled into the usual housing 18 and the window 20 has been fixed substantially parallel to the surface 28 of the photodiode 26.

Figure 6:
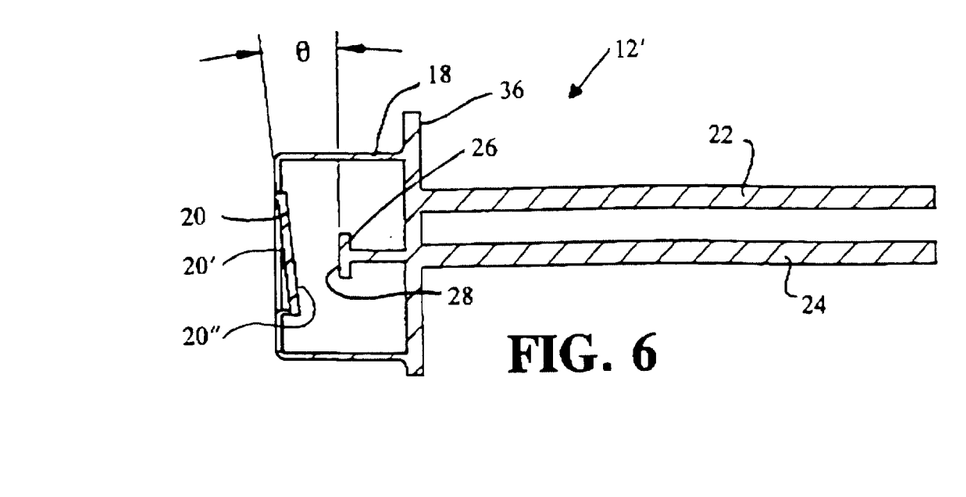
FIG. 6 is a simplified cross-sectional plan view of a photodetector device according to a second embodiment of the invention.

FIG. 6 illustrates a photodetector 12' which has been corrected for polarization dependent response during manufacture. The maximum response axis $R_{MAX}$ and the tilt angle θ could be determined using the procedures described above, but during manufacture, of course, the response of the detector may be measured with or without the window in place. In the photodetector 12' shown in FIG. 6, the photodetector surface 28 is normal to the direction in which light will be incident upon it and the window 20 is tilted by the required tilt angle θ relative to the detector surface 28 as well as the optical axis. The photodetector 12'0 will be polarization independent and so may be used without further tilting of the window 20 or housing 18. Hence since there would be no need to tilt the photodetector 12' when installing it into the usual holder 14, the bracket 14 could be omitted and the photodetector device 12' inserted directly into a suitable hole in the holder 16.

It should also be appreciated that, during manufacture of the photodetector device 12', both the window 20 and the photodiode 26, or only the photodiode 26, could be installed with the required inclination to the maximum response axis of the photosensitive detector 26. Whether or not both the window 20 and the detector surface 28 were tilted would depend upon the level of the inherent polarization dependent response. It should be appreciated, however, that tilting the window would give a greater amount of correction than tilting the detector surface because the window provides two interfaces, namely air/glass and glass/air. It should also be noted that, preferably, the opposite faces of the window are not parallel but rather converge very slightly, i.e. to form a wedge-shaped window, so as to avoid interference effects.

It should be appreciated that the interface need not be within the housing of the photodetector device, but could be provided by a separate part, e.g. a glass plate or the like, disposed upstream in the optical path.

Thus, the invention embraces a photodetector having either or both of its detector surface and a window tilted relative to an optical axis of the device so that it is substantially independent of polarization state, a photodetector secured to a bracket or other mount with some indication as to the orientation of the maximum response axis of the detector, enabling the mount to be installed into equipment and the photodetector tilted to effect the required compensation; and an assemblage of a photodetector and a holder for attaching it to equipment for use.

It should also be appreciated that some combinations of fiber connector 50 and panel holder 16 may screw together directly, in which case an adapter 54 will not be needed.

Figure 7:
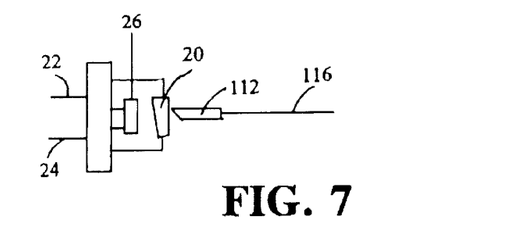
FIGS. 7 and 8 illustrate further modifications of the device.

It is further envisaged that, as illustrated in FIG. 7, where the photodetector device has a pigtail fiber 116 permanently attached, typically by means of a capillary 112, the required PDT for compensating for the PDR of the detector 26 could be introduced by angling the end facet of the fiber 116 relative to the optical axis. The angle of the fiber end surface would be predetermined according to the PDR value of the detector 26, conveniently measured using the method described herein. The correct compensation then would be achieved by rotating one or other of the fiber 112 and the detector 26 relative to the other around the optical axis OA to align the orientation of the angle relative to the maximum response direction $R_{MAX}$ or minimum response direction $R_{MIN}$. The window 20 also would provide some correction.

Figure 8:
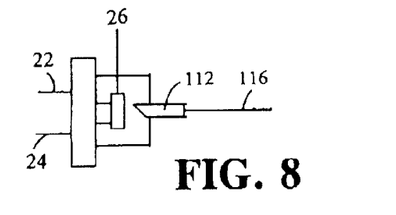

As shown in FIG. 8, however, the window 20 could be omitted and the capillary 112 secured within the opening in place of the window 20. The required correction then would be provided solely by the single interface at the angled end of the fiber 112.

It should also be appreciated that, where the photodetector device has a pigtail fiber permanently attached during manufacture, the required polarization dependent transmission could be introduced by a suitable lateral displacement of the waveguide relative to the optical axis of a lens through which the light beam will pass to the detector. Embodiments of such a photodetector device, and its method of manufacture/adjustment, will now be described with reference to FIGS. 9 to 14.

Figure 9:
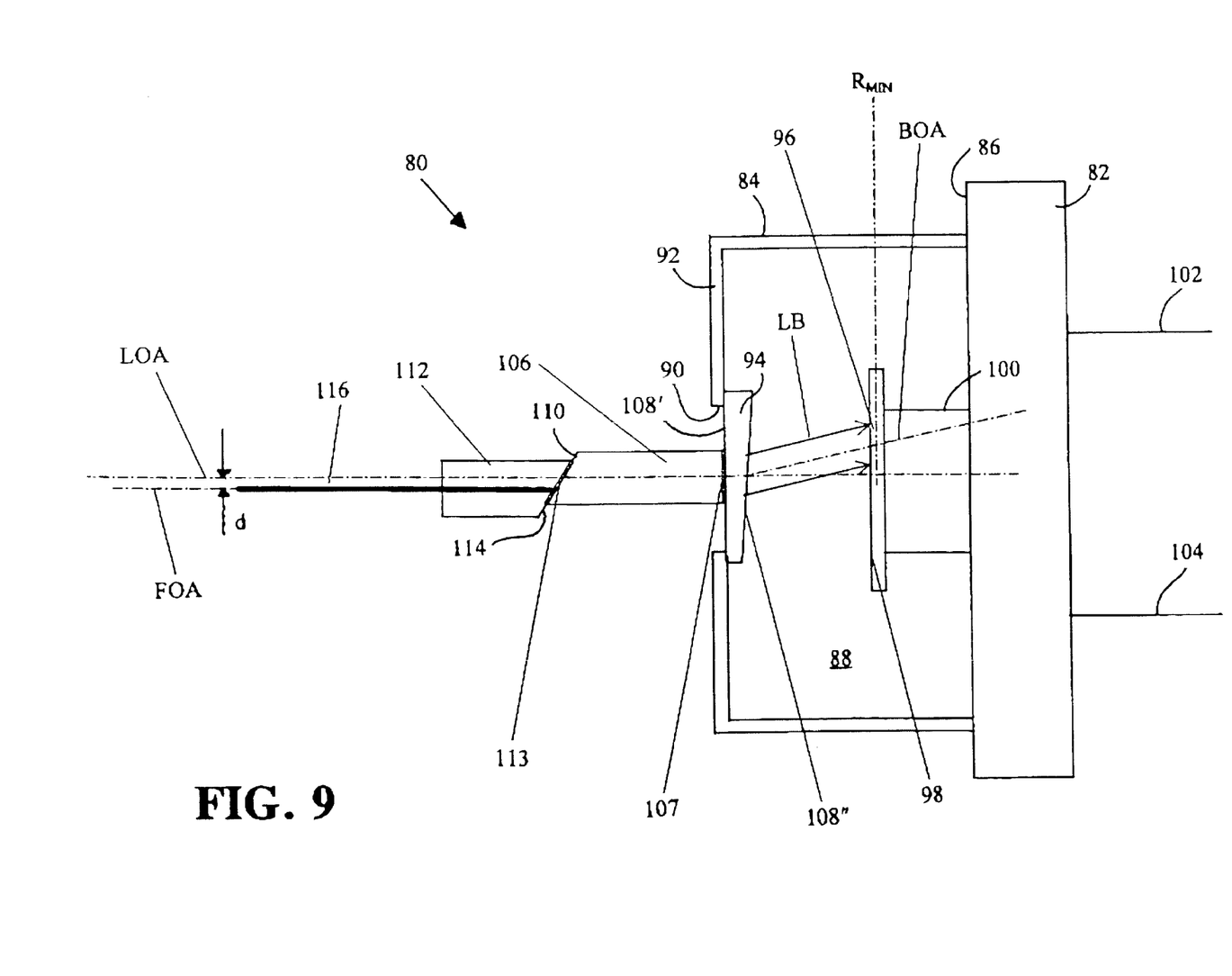
FIG. 9 is a schematic side elevation of an alternative photodetector assembly assembled by a method according to another aspect of the invention.
Figure 10A:
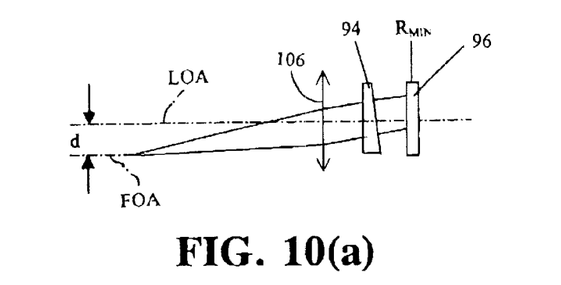
FIGS. 10(a) and 10(b) depict, from the side and one end, the orientations of the various optical axes of the components of the device of FIG. 9.
Figure 10B:
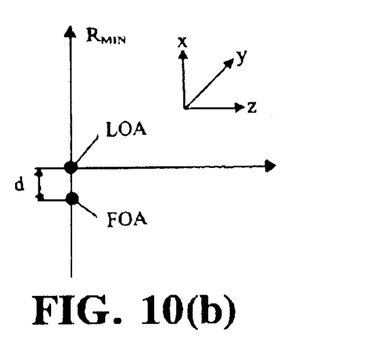

Referring to FIGS. 9, 10(a) and 10(b), a photodetector device 80 comprises a base 82 and a cup-shaped housing 84 attached by its rim to one surface 86 of the base 82 so as to form an enclosure 88. An opening 90 is provided in the middle of a wall 92 of the housing 84 that extends generally parallel to the base 82. The opening 90 is covered by a glass window 94 that is adhered to the interior surface of the wall 92. A photodetector 96, for example an InGaAs photodiode, is mounted in the middle of the enclosure 88 with its detection surface 98 extending generally parallel to, and directed towards, the glass window 94. The photodetector 96 is supported from the base 82 by a mount 100 and is connected to a pair of conductors 102 and 104 which protrude from the furthermost surface of the base 82 for connection to other equipment (not shown).

A graded-index (GRIN) lens 106 has a first end surface adhered by suitable optical adhesive 107, for example as marketed under the name UV NOA61 by Norland Inc., to the middle of the exterior surface 108' of the window 94 so that the optical axis LOA of the GRIN lens 106 is substantially aligned with the centre of the detector surface 98. The opposite end surface 110 of the GRIN lens 106 extends obliquely to the optical axis LOA at an angle of, say, 6 degrees. A short length of fiber capillary 112 has an end surface 114 inclined at a similar oblique angle and adhered by optical adhesive 113 to the oblique surface 110 of the GRIN lens 106. An optical (pigtail) fiber 116 extends coaxially through the fiber capillary 112 and its end abuts the oblique surface 110 of the GRIN lens 116. The end of the fiber 116 also is inclined at the same angle as the surface 114 of the capillary 112. This fiber 116 may either be single-mode or multimode at the operating wavelength of interest. As shown in FIG. 10(a), the optical axis FOA of the fiber 116 extends generally parallel to the optical axis LOA of the GRIN lens 106.

The window 94 is wedge-shaped, in order to significantly reduce interference effects.

Light entering the photodetector device 80 via the fiber 116 will pass through the GRIN lens 106 and the window 94 and impinge upon the detector surface 98. As shown in FIG. 9, the capillary 112 and the GRIN lens 106 are offset laterally relative to each other, in the direction of the minimum response axis $R_{MIN}$, with the result that the beam optical axis BOA of the light beam LB will be inclined relative to the lens optical axis LOA by an angle θ. The size of the offset "d" will determine the size of angle θ. Consequently, when the light beam LB is incident upon the detector surface 98 and the window surface 108", it is not perpendicular to either. As will be described hereinafter, during manufacture, the offset "d" is adjusted until polarization dependent transmission effects caused by the light beam LB leaving the lens 106 with its optical axis BOA inclined relative to the lens optical axis LOA substantially counteract the inherent PDR of the detector 96 so as to minimize the overall or effective PDP of the photodetector device 80.

The inclined window surface 108" serves primarily to minimize interference effects and its angle of inclination, typically 2 degrees, is chosen to be significantly different from the aforementioned angle of incidence θ, so as to ensure low backreflection.

As a practical example, for an InGaAs detector 96 with a PDR of 0.02 dB and a window 94 having a refractive index of 1.5, it was found that the angle θ should be about 7.5 degrees, which was obtained using a GRIN lens 106 having a focal length of 1.9 mm displaced relative to the fiber 116 by about 0.25 mm.

Figure 11:
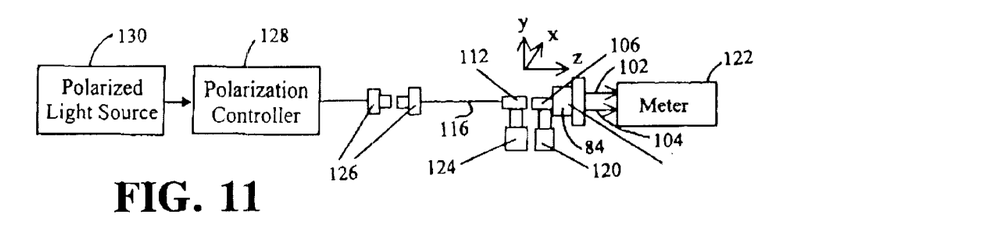
FIG. 11 illustrates equipment used in adjusting the device of FIG. 9 during manufacture.

Adjustment of the photodetector 80 during production will now be described. Referring to FIG. 11, with the GRIN lens 106 glued to the glass window 96, the housing 84 is supported by a first holder 120 and the conductors 102 and 104 connected to an ammeter 122. The fiber capillary 112, with the fiber 116 installed inside it, is supported in a second holder 124 and the pigtail fiber 116 coupled by a connector or splice 126 to a polarization scrambler 128 which varies, in time, the SOP of light received from a source 130 of highly polarized light.

The polarization controller 128 is adjusted to vary the SOP of the light beam over a wide range of possible SOPs. Ideally, the SOP is varied through substantially all of the possible states of polarization of the light beam, but in practice, the number of different SOPs will be a representative number of points on the Poincaré sphere.

While the SOP is varying, either one of the GRIN lens 106 and the capillary 112 is adjusted laterally in the plane x-y shown in FIG. 10(b) and the output of the meter 122 is monitored. The lateral movement is made in various directions to determine that which reduces the difference between the maximum and minimum values measured by the meter 122. The actual difference will vary according to the lateral displacement "d" between the fiber optical axis FOA and the lens optical axis LOA, since this will control the angle at which the light beam LB is incident upon the surface 108" and the detector surface 98. For a particular displacement "d", in a particular direction which defines the minimum response axis $R_{MIN}$, the difference between the maximum and minimum values will itself be a minimum. The fiber 116 and capillary 112 then are glued to the GRIN lens 106, using optical adhesive, to fix them at this displacement position. As shown in FIG. 10(b), the minimum response axis $R_{MIN}$ then will intersect the fiber optical axis FOA and the lens optical axis LOA, the latter spaced apart by the distance "d". The maximum response axis $R_{MAX}$ and minimum response axis $R_{MIN}$ are orthogonal so the maximum response axis $R_{MAX}$ will extend perpendicular to both the minimum response axis $R_{MIN}$ and the lens optical axis LOA.

Using the above-described procedures and configurations, therefore, it is possible to substantially minimize the overall PDR of the photodetector device 80 because the polarization dependency introduced by the light beam traversing the surface 108" at an angle that is not perpendicular counteracts the inherent polarization dependency of the detector 96.

Very high return loss achieved by such a photodetector assembly 80 is attributable to the fact that little, or substantially no, residual reflection is coupled back to the fiber 116 from the surfaces 110 and 114, because they are inclined relative to the optical axes LOA and FOA. The same applies at the interior surface 108" of the window 94, and the adjacent end surface of the GRIN lens 106, because the light beam is not normal to the surfaces when it traverses them. It should be appreciated, however, that these surfaces need not be inclined if only PDR reduction is required.

It has also been found that undesirable interference effects are negligible, which is attributed to the use of index matching adhesive between the fiber 116 and the GRIN lens 106 and between the distal end of the GRIN lens 106 and the exterior surface 108' of the window 94, and to the inclination of the surfaces 110, 114 and 108" of the fiber 116, lens 106 and window 94, respectively.

It has been found that this arrangement makes it possible to produce a virtually ideal detector 80 with minimum PDR, backscatter and Fabry-Perot-type interference effects.

Figure 12:
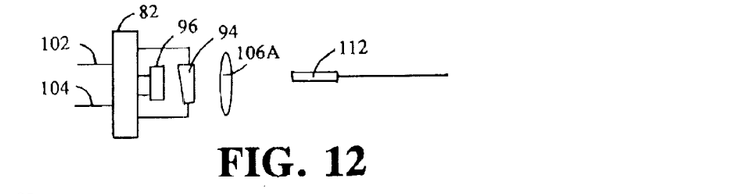
FIG. 12 illustrates a first modification of the device of FIG. 11.

Although it is preferred to use a GRIN lens 106 for reasons of compactness, ruggedness and ease of fabrication, it will be appreciated that the concept taught by the present invention, i.e. using polarization dependent transmission (PDT) of an interface to compensate for PDR of the detector chip 96, can be implemented with other configurations. For example, as illustrated in FIG. 12, the GRIN lens 106 may be replaced by a bulk-optic lens (e.g. "singlet" convex lens) 106A, the capillary 112 and fiber waveguide 116 then fixed with the end of the fiber 116 in the focal plane of the convex lens 106A so that the light beam LB leaves the lens 106A collimated. The required PDT then is provided by both the lens 106A and the window 94. If desired, the end of the fiber waveguide 116 need not be located at the focal plane, in which case the light beam LB would diverge or converge.

Figure 13:
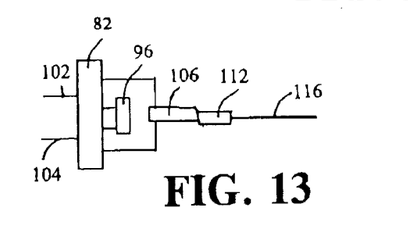
FIGS. 13 and 14 illustrates further modifications of the device of FIG. 11.
Figure 14:
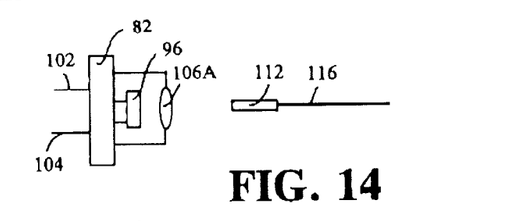

Of course, the GRIN lens 106 or the convex lens 106A could be fixed at a suitable spacing from the window 94, providing the required degree of displacement "d" is provided and any interference effects can be tolerated, It is also envisaged that, as illustrated in FIGS. 13 and 14, which show modifications of the devices of FIGS. 9 and 12, respectively, the window 94 could be omitted and the lens 106 or 106A installed into the opening 90 to serve also as a window. Depending upon the precise type of lens, either or both of the surfaces of the lens 106/106A would introduce the required PDT to compensate for the PDR of the detector chip 96.

It is also envisaged that the glass window or the lens could be attached or formed directly upon the surface of the detector (26; 96).

It should be appreciated, therefore, that the invention is predicated upon the fact that the transmission (T) of a light beam through an interface between two dielectric media having different refractive indexes becomes polarization dependent if the light beam does not traverse the interface in a direction that is normal to the interface. The SOPs related to maximum transmission $T_{MAX}$ and minimum transmission $T_{MIN}$ are orthogonal and linear, with P-polarization having a higher transmission than S-polarization.

Industrial Applicability

An advantage of embodiments of the invention is that the compensation for polarization dependent response can be effected during or after manufacture simply by appropriate tilting of at least one interface, i.e., at the surface of the photosensitive detector and/or an adjacent window and/or a fiber waveguide end facet, relative to an axis along which light for detection will be incident upon the detection surface of the photodetector or, in the case of pigtail photodetectors embodying the present invention, offsetting the pigtail fiber relative to the input lens.

What is claimed is:

1. A photodetector device comprising a photosensitive detector (26; 96) formed from a material having a polarization dependent response having maximum (RMAX) and minimum (RMIN) values corresponding to substantially linear states of polarization of light incident thereupon that are orthogonal to each other, and at least one interface (20; 28; 94) through which a light beam for detection passes before being incident upon a detection surface (28) of the detector (12), the light beam traversing said at least one interface with a propagation direction that is not normal to the interface, the arrangement being such that said at least one interface is tilted about an axis substantially parallel to the direction of the linear state of polarization corresponding to said maximum (RMAX) value and by such a tilt angle that polarization dependent transmission introduced by the at least one interface will compensate at least partially for the polarization dependent response of the material of the photosensitive detector (26).

2. A photodetector device according to claim 1, comprising a window (20; 94) whereby, in use, the light is directed onto the detection surface (28), said detection surface and two opposite surfaces (20',20"; 108',108") of the window (20; 94) providing three said interfaces, cumulatively providing the compensation for polarization dependent response.

3. A photodetector device according to claim 2, further comprising connector means (16) for releasably attaching to the device a waveguide (52) for directing the light to said window (20) along an optical axis (OA) of the waveguide (52), each of said three interfaces being at an acute angle to said optical axis (OA).

4. A photodetector device according to claim 3, wherein the photosensitive detector (26) is mounted in a housing (18) of the photodetector device (12), and the window (20) is mounted in a wall of the housing (18) such that the detection surface (28) and the window are generally parallel to each other, and the housing (18) is secured relative to said connector means (16) such that the three interfaces have the required tilt relative to the optical axis (OA).

5. A photodetector device according to claim 2, wherein the window (20; 94) is wedge-shaped, having a wedge angle significantly less than the angle between the propagation direction of the light and the normal to either surface of the window.

6. A photodetector device according to claim 1, comprising a window (20; 94) whereby, in use, the light is directed onto the detection surface (28), the detection surface (28; 98) being substantially normal to the propagation direction of the light when incident thereupon, opposite surfaces (20', 20"; 108', 108") of the window providing two said interfaces that cumulatively provide the compensation for polarization dependent response.

7. A photodetector device according to claim 6, further comprising connector means (16) means for releasably attaching to the device a waveguide for directing the light to said window (20; 94) such that on leaving the window, the light is incident upon the detection surface (28) substantially normal thereto.

8. A photodetector device according to claim 7, wherein the photosensitive detector (26) is mounted in a housing (18), and the window (20) is mounted in a wall of the housing such that opposite surfaces (20', 20") of the window are inclined relative to the detection surface (28).

9. A photodetector device according to claim 6, wherein the window (20; 94) is wedge-shaped, having a wedge angle significantly less than the angle between the propagation direction of the light and the normal to either surface of the window.

10. A photodetector device according to claim 1 further comprising connector means (16) for releasable attachment of an optical fiber connector (50) thereto such that light from an optical fiber (52) coupled by the connector (18) is directed through said at least one interface onto the detection surface (28) with the required propagation direction.

11. A photodetector device according to claim 1, wherein the device is secured to a mount (14) with said axis having a predetermined orientation relative to a reference surface of the mount, the mount (14) being secured to said connection means (16) by releasable fastening means which, when released, allows tilting of the mount (14) about said axis.

12. A photodetector device according to claim 1, further comprising lens means (106,106A) and an input optical waveguide means (116) for directing a light beam, in use, through the lens means (106) and onto the detection surface (28), the optical waveguide means (116) having its end face from which the light beam emerges secured relative to the lens means (106,106A) and displaced transversely relative to an optical axis (LOA) of the lens means so that the propagation direction of the light beam when leaving the lens means (106) will be inclined relative to the lens means optical axis (LOA) by such an angle that polarization dependent transmission introduced thereby at least partially corrects for polarization dependent response of the photosensitive detector (26).

13. A photodetector device according to claim 12, wherein the lens means comprises a GRIN lens.

14. A photodetector device according to claim 12, further comprising a window (20; 94) the light beam being directed, in use, through the lens means (106) and said window (20; 94) onto the detection surface (28), at least that surface (108") of the window facing the detector constituting a said interface.

15. A photodetector device according to claim 14, wherein the lens means (106) comprises a GRIN lens having one end attached to the window (94) and its opposite end attached to the optical fiber waveguide (116, 112).

16. A photodetector device according to claim 12, wherein the optical waveguide means (116) is supported by a capillary (112), the capillary (112) being bonded to the lens means (106).

17. A photodetector device according to claim 12, wherein the photosensitive detector (26) is mounted in a housing (84) of the photodetector device and the lens means (106) is attached to the housing (84) so as to direct light onto the detector (12) through an opening (90) in the housing, the lens means receiving the light from a fiber waveguide (116, 112) which is offset in a direction transverse to the optical axis (LOA) of the lens means (106) such that the light beam leaves the lens means (106) along a beam axis that is not parallel to the lens means optical axis (LOA).

18. A photodetector device according to claim 1, wherein the photosensitive detector (26; 96) comprises a semiconductor diode.

19. A photodetector device according to claim 18, wherein the semiconductor diode comprises an indium gallium arsenide (InGaAs) semiconductor diode.

20. A method of assembling a photodetector device comprising a photosensitive detector (12; 96) formed from a material having a polarization dependent response having maximum (RMAX) and minimum (RMIN) values corresponding to mutually orthogonal substantially linear states of polarization of light incident thereupon, lens means (106) and an input optical waveguide means (116) for directing a light beam, in use, through the lens means (106) and onto a detection surface (28; 98) of the photodetector (12; 96) so that the propagation direction of the light beam when leaving the lens means (106) will be inclined relative to the lens means optical axis (LOA) by such an angle that polarization dependent transmission introduced thereby substantially corrects for polarization dependent response of the photosensitive detector material, the method comprising the steps of directing a polarized light beam onto the detector (12; 96) via said lens means (106) and varying the state of polarization of the light beam between a large number of possible states; adjusting the displacement of the optical waveguide means (116) transversely relative to the optical axis of the lens means (106) while monitoring the difference between maximum and minimum values of the detector output signal; and fixing the optical waveguide means (116) relative to the lens means (106) at a transverse displacement corresponding to the difference being a minimum.

21. A method of connecting for polarization dependent response of a photodetector device comprising a photosensitive detector (26; 96) formed from a material having a maximum response (RMAX) corresponding to linear state of polarization of light incident thereupon via at least one interface (20',20'',28,98) between media having different refractive indices, the interface intersecting a propagation direction in which, in use, a light beam for detection will be incident upon a detection surface (28; 98) of the detector (26; 96), the photosensitive detector having a photodetector axis (PDA) perpendicular to its detection surface, the method comprising the steps of:

with the photodetector device mounted rotatably in a connector part (16) with said photodetector axis (PDA) extending at an arbitrary acute angle (θ) to an optical axis (OA) of said connector part, directing polarized light onto the detection surface (28; 98);

while varying the state of polarization of the light successively between a substantial number of points on the Poincaré sphere, monitoring an electrical output signal from the photosensitive detector (26; 96) and registering the difference between maximum and minimum values thereof;

rotating the photodetector device (12) step by step using the photodetector axis (PDA) as a rotation axis, at each step, registering the difference between the maximum and minimum response and determining the rotation angle for which the difference is a minimum;

while maintaining said rotation angle constant, varying the state of polarization again through a substantial number of points on the Poincaré sphere, monitoring the output of the photosensitive detector (26; 96), adjusting the acute angle (θ) with respect to the optical axis (OA), in a step by step manner, and determining the acute angle at which the difference between the maximum and minimum values is a minimum; and securing the photodetector device to the connector part (16) to maintain said rotation angle and said acute angle at which the difference between the maximum and minimum values is a minimum.

22. A method according to claim 21, wherein the photodetector device is tilted by between 5 degrees and 8 degrees.

23. A method of correcting for polarization dependent response of a photodetector device comprising a photosensitive detector (26; 96) formed from a material having a maximum response (RMAX) corresponding to linear state of polarization of light incident thereupon via at least one interface (20',20'',28,98) between media having different refractive indices, the interface intersecting a propagation direction in which, in use, a light beam for detection will be incident upon a detection surface (28; 98) of the detector (26; 96), the method comprising the steps of:

determining orientation of either or both of a maximum response axis and minimum response axis that correspond to states of polarization of incident light for which the response of the photodetector is a maximum or a minimum, respectively; and adjusting an angle between the propagation direction and the interface in a plane of the maximum response axis such that polarization dependent transmission introduced by the at least one interface at least partially compensates for polarization dependent response of the detector (12).

24. A method according to claim 23, wherein determination of the maximum response axis comprises the steps of:

directing a substantially symmetrical, polarized light beam onto the detector and monitoring a corresponding output signal of the detector;

varying the state of polarization between a substantial number of possible states;

identifying either or both of maximum and minimum values of the detector output signal; and while maintaining that state of polarization which provided the maximum or minimum value, analyzing the light to determine the orientation of the maximum response axis of the detector.

25. A method according to claim 24, wherein the analyzing step comprises the steps of:

disposing a polarizer in the collimated light beam, rotating the polarizer and monitoring the detector output signal to establish that orientation of the polarizer corresponding to maximum or minimum response, and transferring that orientation to the detector as an indication of the maximum response axis or minimum response axis, respectively, of the detector.

26. A method according to claim 23, wherein the orientation of the maximum response axis is determined by the steps of directing linearly-polarized light onto the detector along said optical axis, monitoring an output signal from the detector, and determining the orientation of the maximum response axis as the direction of the SOP for which said output signal is a maximum.

27. A method according to claim 23, further comprising the step of determining said angle by directing linearly polarized light onto the detector along the optical axis, repeatedly rotating the SOP of the linearly polarized light beam about the optical axis, tilting the at least one interface relative to the optical axis and about the maximum response axis, and determining said angle for which the difference between maximum and minimum responses of the photodetector is substantially minimal.

28. A method according to claim 23, wherein, the photosensitive detector being housed in a housing having a window through which light for detection will pass to the photosensitive detector, the window providing at least two said interfaces, the step of adjusting the angle comprises the step of tilting the window relative to both the surface of the photosensitive detector and the optical axis, and the securing step comprises the step of securing the window to the housing.

29. A method according to claim 23, wherein, the detector and a window are fixed relative to each other in a housing of the photodetector device such that light for detection will pass through the window to the detector, the step of tilting the interface comprises the step of tilting the housing.

30. A method according to claim 23, further comprising the steps of:

mounting the photodetector device in a mount;

directing a polarized light beam normally onto a detection surface of the detector, varying the state of polarization of the light beam and measuring the photodetector response for different states of polarization;

determining said axis corresponding to maximum response of the photodetector; and securing the photodetector to the mount with the maximum response axis having a known orientation relative to a reference surface of the mount.

31. A method according to claim 30, further comprising the steps of:

attaching the mount to a holder;

directing a polarized light beam onto the detector along said optical axis;

repeatedly varying the SOP of the polarized light beam between a substantial number of possible states, tilting the mount relative to the holder and about the maximum response axis and measuring the response of the photodetector so as to determine a tilt angle at which the difference between maximum and minimum responses of the photodetector is minimal, and securing the mount to the holder so as to maintain said tilt angle.

32. A photodetector device comprising a photosensitive detector (26) formed from a material having a polarization dependent response having maximum (RMAX) and minimum (RMLN) values corresponding to substantially linear states of polarization of light incident thereupon that are orthogonal to each other, and a fiber waveguide (116) for directing a light beam for detection onto a detection surface (28) of the detector (26), the waveguide (116) being fixed relative to the detector (26) and having an end face facing the detection surface (28), the end face being inclined relative to a propagation direction of a said light beam about an axis substantially parallel to the direction of the liner state of polarization corresponding to said maximum (RMAX) value and by such an angle that polarization dependent transmission effects introduced by the end face at least partially compensate for polarization dependent response of the material of the detector (98).

33. A photodetector device according to claim 32, further comprising a window (20) interposed between the fiber waveguide end face and the detector (26).

34. A photodetector device according to claim 32, wherein the photosensitive detector (26; 96) comprises a semiconductor diode.

35. A photodetector device according to claim 34, wherein the semiconductor diode comprises an indium gallium arsenide (InGaAs) semiconductor diode.

\* \* \* \* \*